(12) United States Patent
Ishii

(10) Patent No.: US 8,149,583 B2
(45) Date of Patent: Apr. 3, 2012

(54) STORAGE DEVICE AND ELECTRONIC APPARATUS

(75) Inventor: Norihiro Ishii, Akishima (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/965,071

(22) Filed: Dec. 10, 2010

(65) Prior Publication Data

US 2011/0199747 A1    Aug. 18, 2011

(30) Foreign Application Priority Data

Feb. 17, 2010  (JP) .................. 2010-032958

(51) Int. Cl.
H05K 1/14    (2006.01)
(52) U.S. Cl. .................. 361/737; 361/752; 361/679.31; 361/679.32; 361/679.33
(58) Field of Classification Search .................. 361/737, 361/752, 679.31, 679.32, 679.33
See application file for complete search history.

(56) References Cited

U.S. PATENT DOCUMENTS

| 6,549,418 B1* | 4/2003 | Deeney | 361/736 |
| 2008/0124967 A1* | 5/2008 | Hsieh | 439/377 |

FOREIGN PATENT DOCUMENTS

| JP | 61-166597 | 7/1986 |
| JP | 02-102791 | 4/1990 |
| JP | 03-255697 | 11/1991 |
| JP | 2-232779 | 4/1992 |
| JP | 06-090072 | 3/1994 |
| JP | 07-079082 | 3/1995 |
| JP | 07-160837 | 6/1995 |
| JP | 10-065385 | 3/1998 |
| JP | 10-307641 | 11/1998 |
| JP | 11-202978 | 7/1999 |
| JP | 11-259161 | 9/1999 |
| JP | 11-282577 | 10/1999 |
| JP | 2000-020171 | 1/2000 |
| JP | 2000-196266 | 7/2000 |
| JP | 2001-168563 | 6/2001 |
| JP | 2002-271331 | 9/2002 |
| JP | 2002-280776 | 9/2002 |
| JP | 2002-324989 | 11/2002 |
| JP | 2003-218565 | 7/2003 |
| JP | 2003-318337 | 11/2003 |
| JP | 2004-006791 | 1/2004 |
| JP | 2010-032958 | 2/2007 |
| JP | 2007-250276 | 9/2007 |
| JP | 2007-305041 | 11/2007 |

(Continued)

OTHER PUBLICATIONS

Information Sheet in 1 page.

(Continued)

*Primary Examiner* — Yuriy Semenenko
*Assistant Examiner* — Andargie M Aychillhum
(74) *Attorney, Agent, or Firm* — Knobbe, Martens, Olson & Bear, LLP

(57) ABSTRACT

According to one embodiment, an electronic apparatus includes a first board, a second board facing the first board, a cover facing the second board from a side opposite to the first board, a first fixing portion attached to the first board and the cover, and a second fixing portion attached to the first board and the second board.

8 Claims, 13 Drawing Sheets

FOREIGN PATENT DOCUMENTS

| | | |
|---|---|---|
| JP | 2008-235725 | 10/2008 |
| JP | 2009-026780 | 2/2009 |
| JP | 2009-064248 | 3/2009 |
| JP | 2009-157828 | 7/2009 |
| JP | 2009-158846 | 7/2009 |
| WO | WO 2007/029311 A1 | 3/2007 |

OTHER PUBLICATIONS

Final Office Action from related application No. 2010-032958, dated May 17, 2011 with English Translation.

* cited by examiner

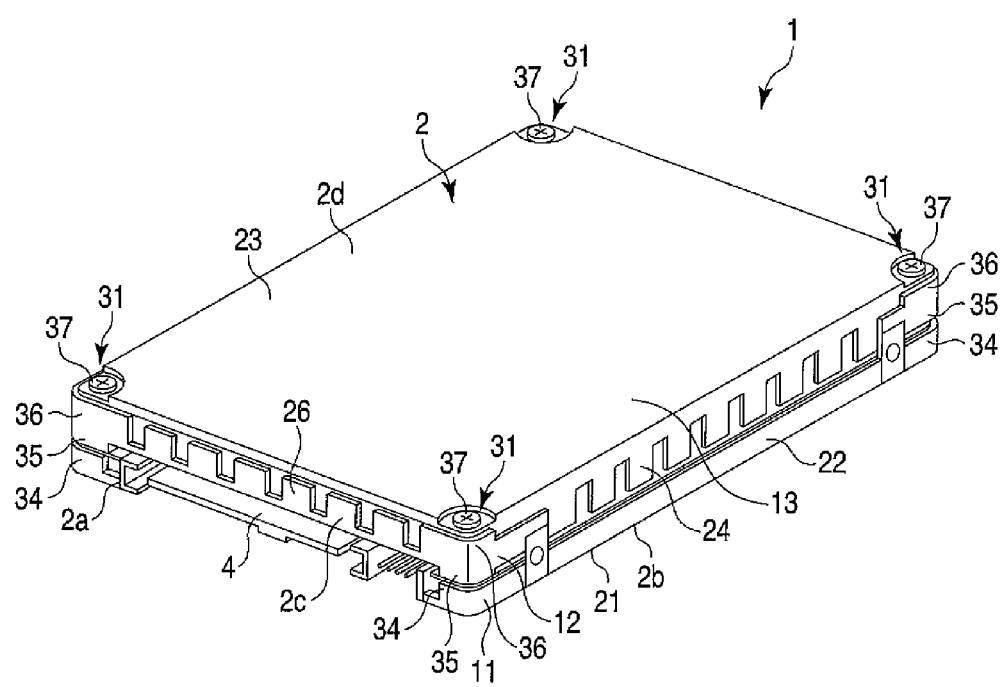
F I G. 1

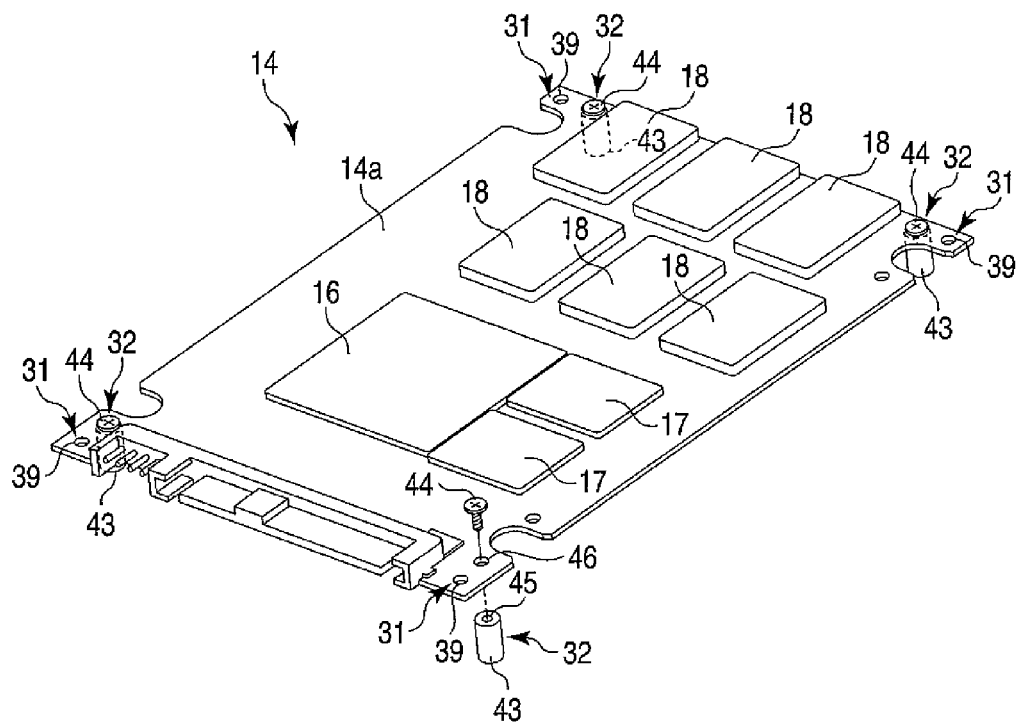
F I G. 7
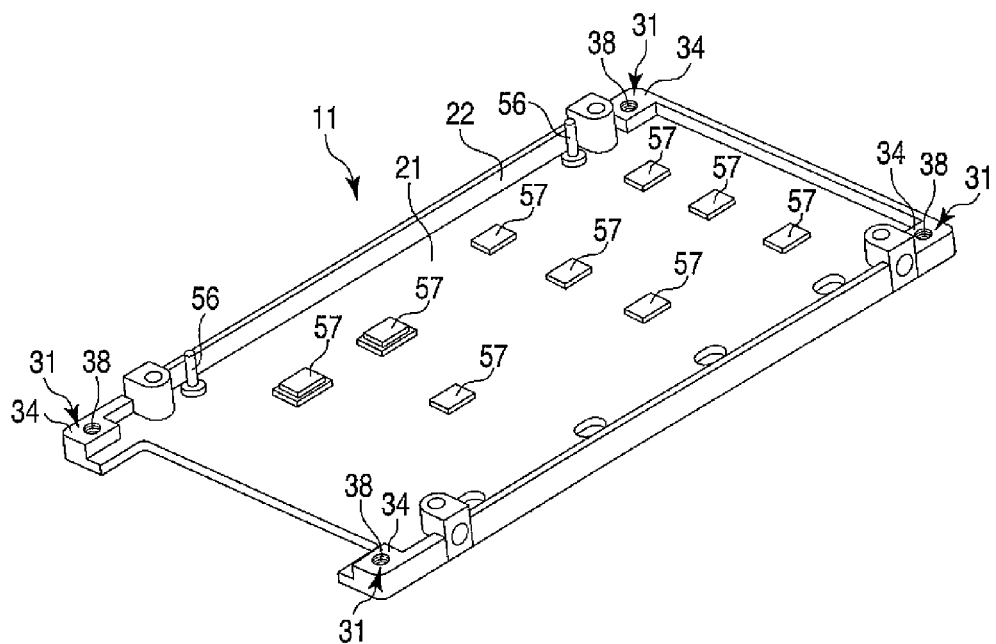
F I G. 8

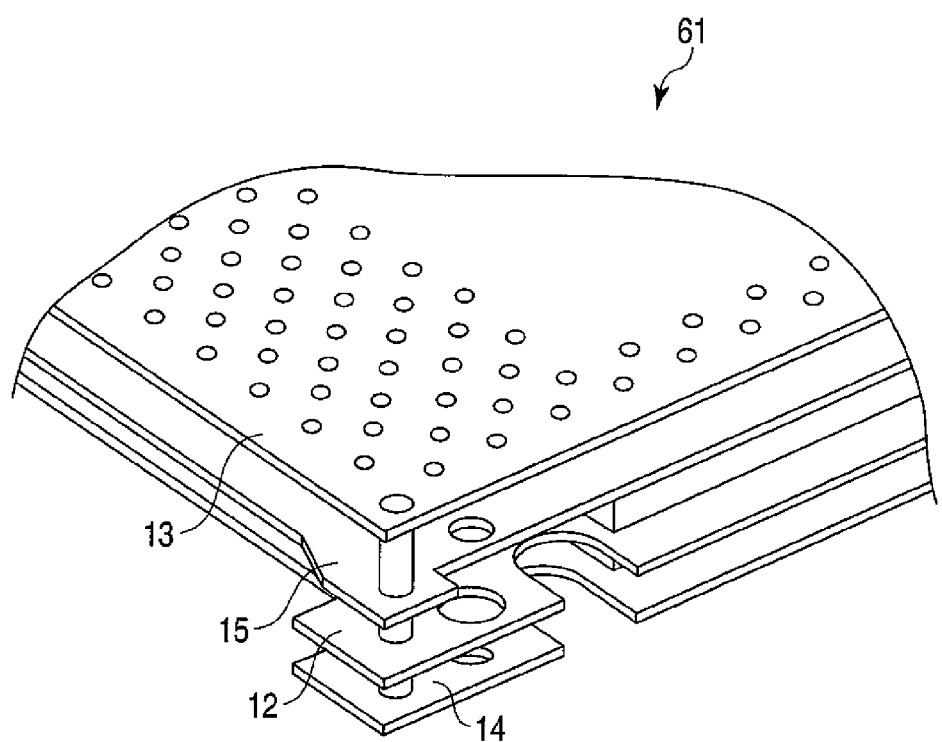
F I G. 16

STORAGE DEVICE AND ELECTRONIC APPARATUS

CROSS-REFERENCE TO RELATED APPLICATIONS

This application is based upon and claims the benefit of priority from Japanese Patent Application No. 2010-032958, filed Feb. 17, 2010; the entire contents of which are incorporated herein by reference.

FIELD

Embodiments described herein relate generally to a storage device and an electronic apparatus which include a circuit board.

BACKGROUND

A solid state drive (SSD) has been known as one of the electronic apparatuses.

Jpn. Pat. Appln. KOKAI Publication No. 2009-157828 discloses an SSD including a board in a housing and a memory controller on the board.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is a perspective view illustrating an example SSD according to a first embodiment;

FIG. 7 is a perspective view illustrating a main board such as that shown in FIG. 2;

FIG. 8 is a perspective view illustrating a base such as that shown in FIG. 2;

FIG. 16 is a perspective view illustrating a SSD related to the second embodiment;

DETAILED DESCRIPTION

Various embodiments will be described hereinafter with reference to the accompanying drawings.

In general, according to one embodiment, an electronic apparatus comprises a first board, a second board facing the first board, a cover facing the second board from a side opposite to the first board, a first fixing portion attached to the first board and the cover, and a second fixing portion attached to the first board and the second board.

Hereinafter, embodiments applied to an SSD and a notebook personal computer (hereinafter, referred to as a notebook PC) will be described with reference to the accompanying drawings.

First Embodiment

FIGS. 1 to 12 show an SSD 1 according to a first embodiment. The SSD 1 is an example of a "storage device" and is also an example of an "electronic apparatus". The term "storage device" or "electronic apparatus" is not limited to the SSD 1. The embodiment can be widely applied to various kinds of electronic apparatuses including a notebook PC, a display device, such as a television, a recording/reproducing apparatus, a PDA (Personal digital Assistant), and a game machine.

Figure 2:
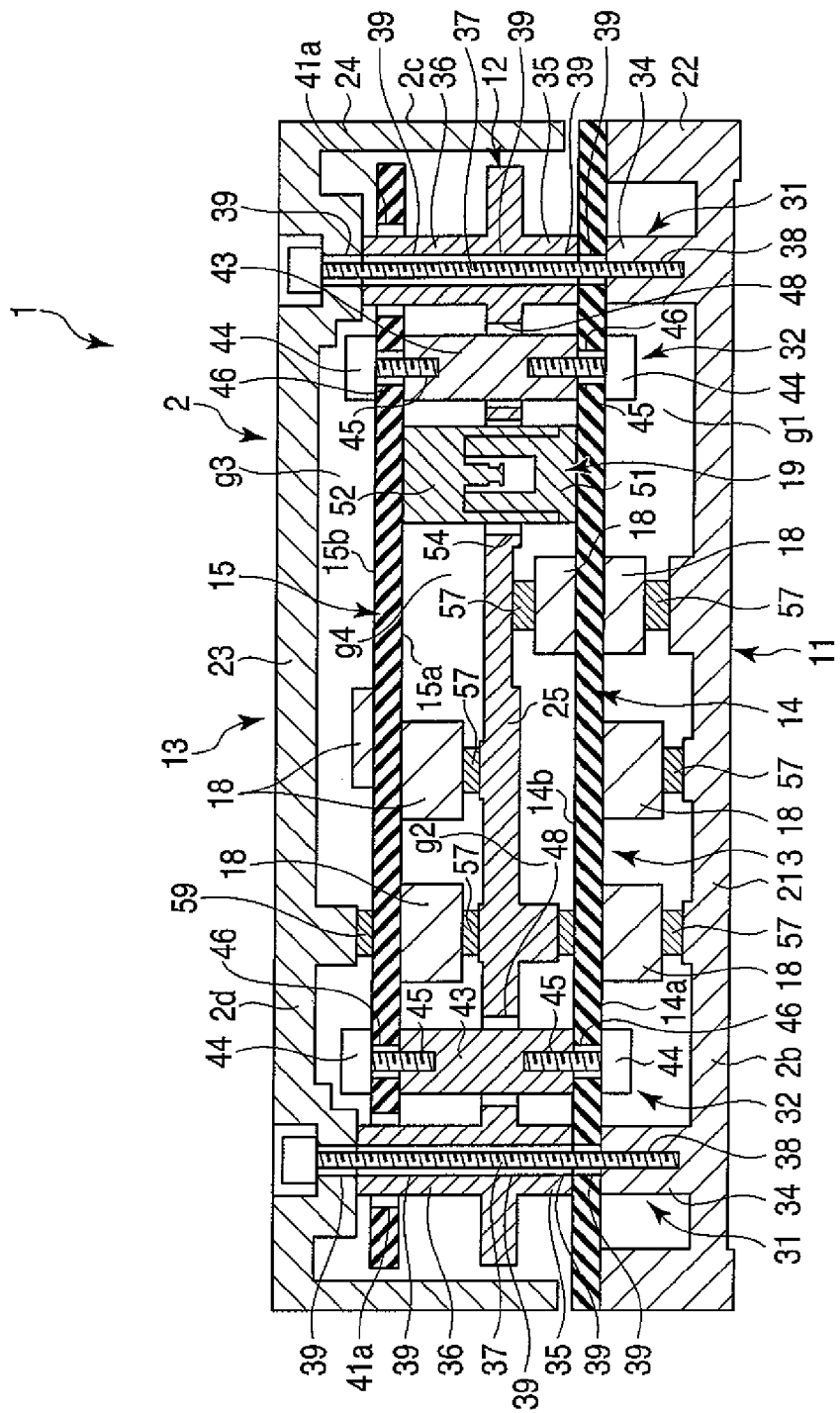
FIG. 2 is a cross-sectional view schematically illustrating the inside of an SSD such as that shown in FIG. 1.

As shown in FIGS. 1 and 2, the SSD 1 comprises a housing 2 and a board unit 3 in the housing 2. The board unit 3 comprises a connector portion 4, which is an external connection portion. The connector portion 4 is exposed to the outside through an opening portion 2a of the housing 2. The SSD 1 is integrated into one module and is configured to be mounted on, for example, various kinds of information processing apparatuses.

The housing 2 comprises a base 11 (bottom cover), a middle base 12, and a cover 13 (top cover). The board unit 3 comprises a main board 14 and a daughter board 15.

The main board 14 is an example of a "first board". As shown in FIG. 2, the main board 14 comprises a first surface 14a and a second surface 14b. The first surface 14a is, for example, the lower surface and faces the base 11. The second surface 14b is, for example, the upper surface and faces the middle base 12.

Figure 3:
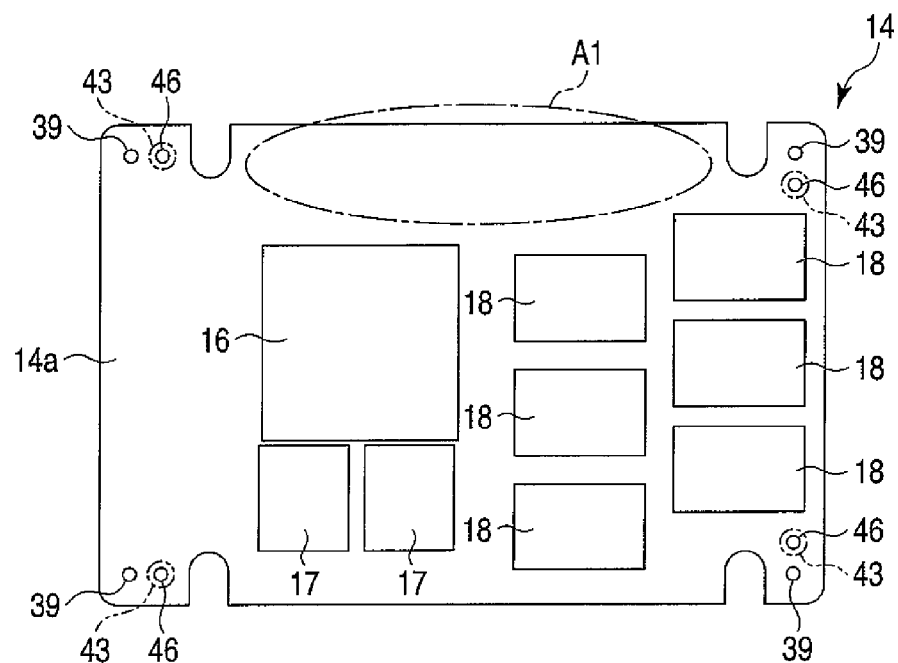
FIG. 3 is a bottom view illustrating a main board such as that shown in FIG. 2.

As shown in FIG. 3, a control IC 16, two double data rate (DDR) chips 17, and plural NAND memory chips 18 are on the first surface 14a. Each of the DDR chip 17 and the NAND memory chip 18 is an example of a "memory chip". The connector portion 4 is on the main board 14.

Figure 4:
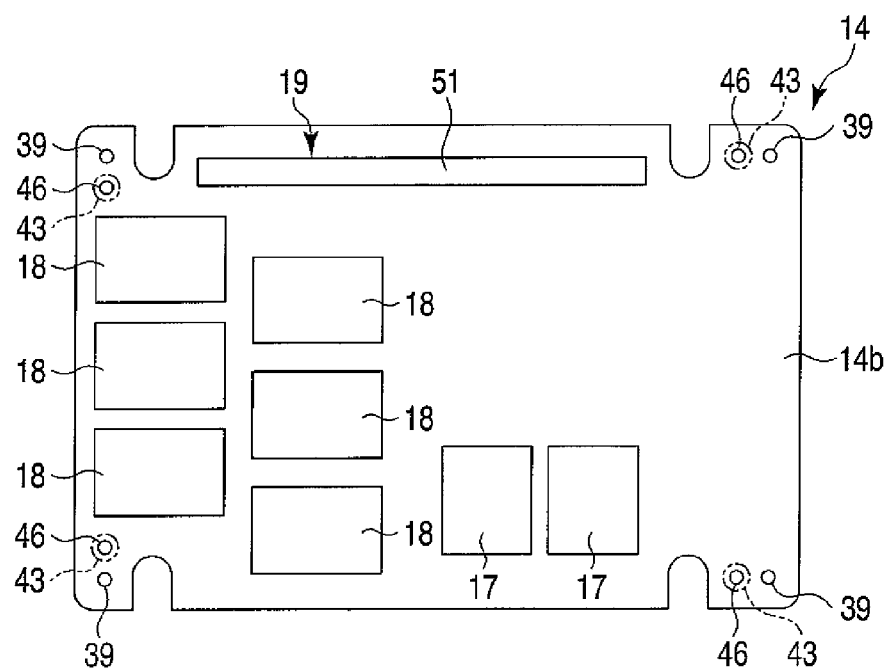
FIG. 4 is a top view illustrating a main board such as that shown in FIG. 2.

As shown in FIG. 4, two DDR chips 17, plural NAND memory chips 18, and a connector 19 are on the second surface 14b. The detailed mounting structure of the connector 19 will be described below.

The daughter board 15 is an example of a "second board". As shown in FIG. 2, the daughter board 15 is arranged substantially in parallel to the main board 14 and faces the main board 14. The main board 14 may be an example of a "second board" and the daughter board 15 may be an example of a "first board".

As shown in FIG. 2, the daughter board 15 comprises a first surface 15a and a second surface 15b. The first surface 15a is, for example, the lower surface and faces the middle base 12. The second surface 15b is, for example, the upper surface and faces the cover 13.

Figure 5:
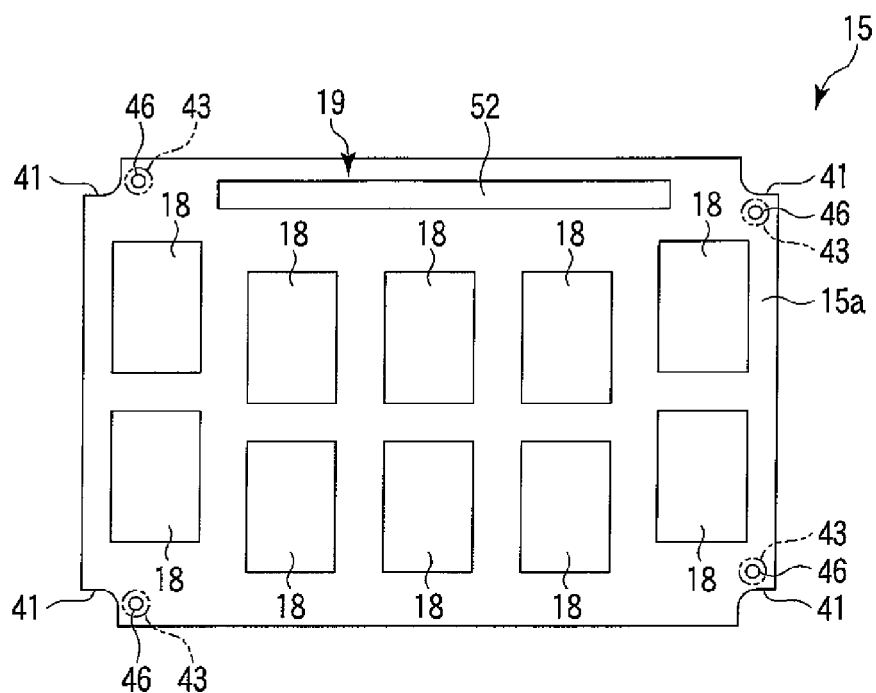
FIG. 5 is a bottom view illustrating a daughter board such as that shown in FIG. 2.
Figure 6:
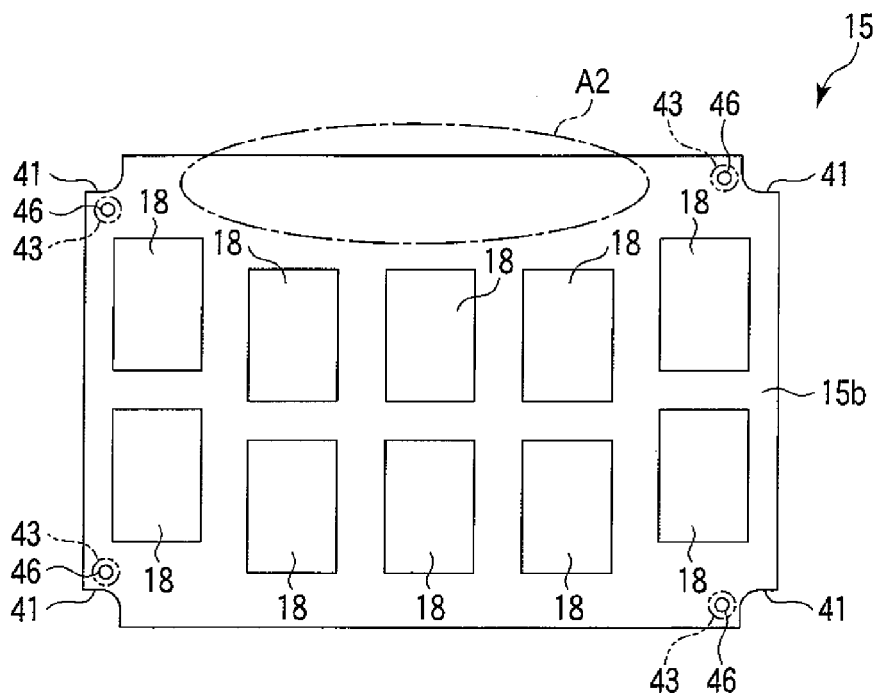
FIG. 6 is a top view illustrating a daughter board such as that shown in FIG. 2.

As shown in FIG. 5, the plural NAND memory chips 18 and the connector 19 are on the first surface 15a. The daughter board 15 is electrically connected to the main board 14 through the connector 19. As shown in FIG. 6, the plural NAND memory chips 18 are on the second surface 15b.

As shown in FIG. 2, the base 11 is, for example, a base plate made of a metal plate. The base 11 is an example of a "first base". The base 11 faces the main board 14 from a side opposite to the middle base 12. The base 11 comprises a main portion 21 and a rising portion 22. The main portion 21 has a plate shape extending substantially in parallel to the main board 14 and forms a lower wall 2b of the housing 2. The rising portion 22 rises from the edge of the main portion 21 and forms a part of a circumferential wall 2c of the housing 2.

As shown in FIG. 2, the cover 13 is, for example, a metal plate. The cover 13 faces the daughter board 15 from a side opposite to the middle base 12. The cover 13 comprises a main portion 23 and a rising portion 24. The main portion 23 has a plate shape extending substantially in parallel to the daughter board 15 and forms an upper wall 2d of the housing 2. The rising portion 24 rises from the edge of the main portion 23 and forms a part of the circumferential wall 2c of the housing 2.

The middle base 12 is a center plate, for example, made of a metal plate. The middle base 12 may also be referred to as a middle frame or a center base. The middle base 12 is an example of a "second base".

The middle base 12 is one of the reinforcing members, is between the main board 14 and the daughter board 15, and reinforces the housing 2. The middle base 12 comprises a main portion 25 and a rising portion 26. The main portion 25 comprises a plate shape extending substantially in parallel to the main board 14. The rising portion 26 rises from the edge of the main portion 25 and forms a part of the circumferential wall 2c of the housing 2.

For example, the middle base 12 is thicker than each of the base 11 and the cover 13 and has rigidity higher than that of the base 11 or the cover 13. The middle base 12, the base 11, and the cover 13 have a linear expansion coefficient of for example, 24 ppm/° C., and the main board 14 and the daughter board 15 have a linear expansion coefficient of, for example, 15 ppm/° C.

That is, a metal member, such as the middle base 12, is more likely to be thermally expanded than a circuit board, such as the main board 14. Therefore, when the SSD 1 is thermally expanded, the expansion of the middle base 12 is dominant, and the base 11, the cover 13, the main board 14, and the daughter board 15 follow the deformation of the middle base 12.

Figure 11:
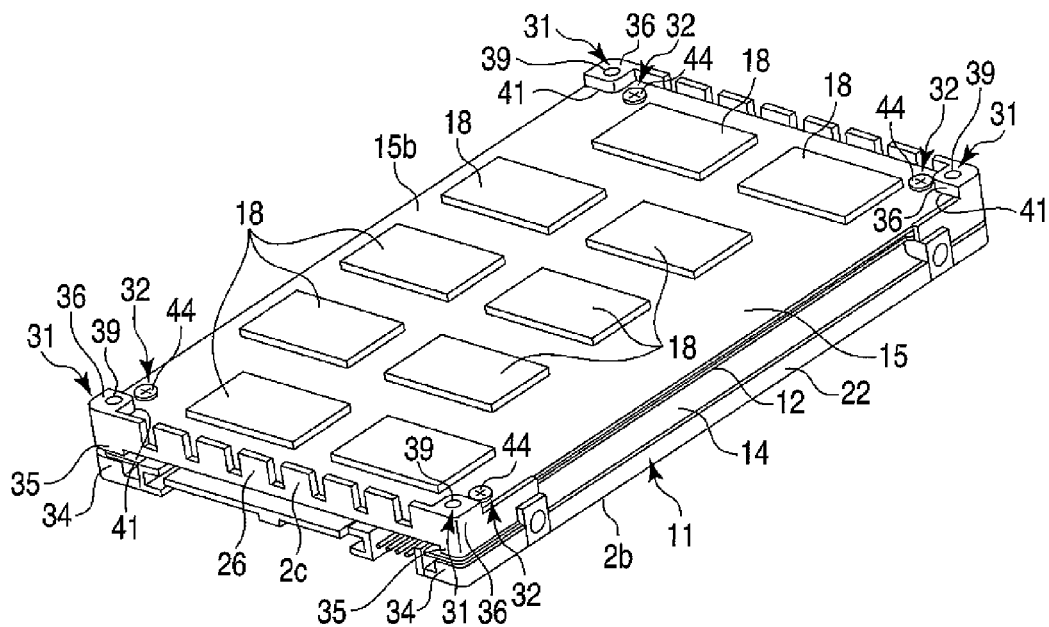
FIG. 11 is a perspective view illustrating a daughter board attached to a structure such as that shown in FIG. 10.

Next, the fixation structure of the base 11, the main board 14, the middle base 12, the daughter board 15, and the cover 13 will be described. As shown in FIG. 2, the base 11, the main board 14, the middle base 12, the daughter board 15, and the cover 13 have substantially the same size. As shown in FIGS. 7 and 11, each of the main board 14 and the daughter board 15 has a rectangular shape with four corners.

As shown in FIG. 2, the SSD 1 comprises first fixing portions 31 and second fixing portions 32. The first fixing portions 31 are provided so as to avoid the daughter board 15 and collectively fix the base 11, the main board 14, the middle base 12, and the cover 13. Four first fixing portions 31 are at four corners of the main board 14. The first fixing portion 31 comprises a first supporting portion 34, a second supporting portion 35, a third supporting portion 36, and a screw 37. The screw 37 is an example of a "fixing member".

As schematically shown in FIG. 2, the first supporting portions 34 are between the base 11 and the main board 14 and support the main board 14. The first supporting portion 34 is, for example, a convex portion provided integrally with the base 11 and comes into contact with the main board 14. The main board 14 is placed on the first supporting portions 34 and a first gap g1 exists between the main board 14 and the base 11. The first supporting portions 34 may be convex portions (boss portions) on the main board 14.

The second supporting portions 35 are between the main board 14 and the middle base 12 and support the middle base 12. The second supporting portion 35 is, for example, a convex portion on the middle base 12 and comes into contact with the main board 14. The middle base 12 is supported by the second supporting portions 35 and a second gap g2 exists between the middle base 12 and the main board 14. The second supporting portions 35 may be convex portions (boss portions) on the main board 14.

The third supporting portions 36 are between the middle base 12 and the cover 13 and support the cover 13. The third supporting portion 36 is, for example, a convex portion on the middle base 12 and comes into contact with the cover 13. The cover 13 is supported by the third supporting portions 36 and a third gap g3 exists between the cover 13 and the middle base 12. The third supporting portions 36 may be convex portions on the cover 13.

As shown in FIG. 2, a screw hole 38, which is an engaging hole, is in the first supporting portion 34. Mutually communicating insertion holes 39 are in the main board 14, the second supporting portion 35, the middle base 12, the third supporting portion 36, and the cover 13. The screws 37 are inserted into the insertion holes 39 and are engaged with the screw holes 38 to integrally fix the base 11, the main board 14, the middle base 12, and the cover 13.

As shown in FIGS. 5 and 11, cut-out portions 41 are provided at four corners of the daughter board 15 so as to avoid the first fixing portions 31. The cut-out portion 41 is considerably larger than the first fixing portion 31. The first fixing portions 31 pass through the cut-out portions 41 and connect the middle base 12 and the cover 13 without contacting the daughter board 15. The first fixing portions 31 are not fixed to the daughter board 15. That is, the daughter board 15 is not directly connected to the base 11, the middle base 12, and the cover 13. As schematically shown in FIG. 2, the daughter board 15 may comprise through holes 41a (first through hole) through which the first fixing portions 31 pass, instead of the cut-out portions 41.

As shown in FIG. 2, the second fixing portions 32 are provided so as to avoid the middle base 12 and fix the main board 14 and the daughter board 15. Four second fixing portions 32 are provided at four corners of the main board 14. The second fixing portion 32 comprises a supporting portion 43 (column) and a pair of screws 44 attached to the supporting portion 43. The screw 44 is an example of a "fixing member".

The supporting portions 43 are between the main board 14 and the daughter board 15 and support the daughter board 15. The daughter board 15 is placed on the supporting portions 43 and a gap g4 exists between the daughter board 15 and the main board 14. That is, the supporting portion 43 also serves as a spacer.

The supporting portion 43 is, for example, a stud attached to the main board 14. The supporting portion 43 comprises a screw hole 45, which is an engaging hole facing the main board 14 or the daughter board 15. Each of the main board 14 and the daughter board 15 comprises insertion holes 46 communicating with the screw holes 45. The screws 44 are inserted into the insertion holes 46 and are then engaged with the screw holes 45 to fix the main board 14 and the daughter board 15 to the supporting portions 43.

As shown in FIG. 2, the middle base 12 comprises through holes 48 (second through holes) provided so as to avoid the second fixing portions 32. The through hole 48 is slightly larger than the second fixing portion 32. The second fixing portions 32 pass through the through holes 48 and connect the main board 14 and the daughter board 15 without contacting the middle base 12. That is, the daughter board 15 is directly connected only to the main board 14 without being fixed to the middle base 12 or the cover 13.

In other words, the daughter board 15 has a floating structure in the housing 2. That is, a structure for connecting a set of the main board 14 and the daughter board 15 which have an approximate property value and a set of the base 11, the middle base 12, and the cover 13 which have an approximate property value (i.e., a structure for connecting sets having different property values) is only provided in the main board 14.

Next, the mounting structure of the connector 19 will be described in detail.

As shown in FIG. 2, the connector 19 is, for example, a surface mounted technology (SMT)-type stacking connector. The connector 19 is between the main board 14 and the daughter board 15 and electrically connects them.

The connector 19 comprises a first portion 51 (first mold) on the main board 14 and a second portion 52 (second mold) on the daughter board 15. The first portion 51 is for example, a plug. The second portion 52 is, for example, a socket into which the plug is inserted. The first portion 51 is fitted to the second portion 52 to electrically connect the main board 14 and the daughter board 15.

Figure 9:
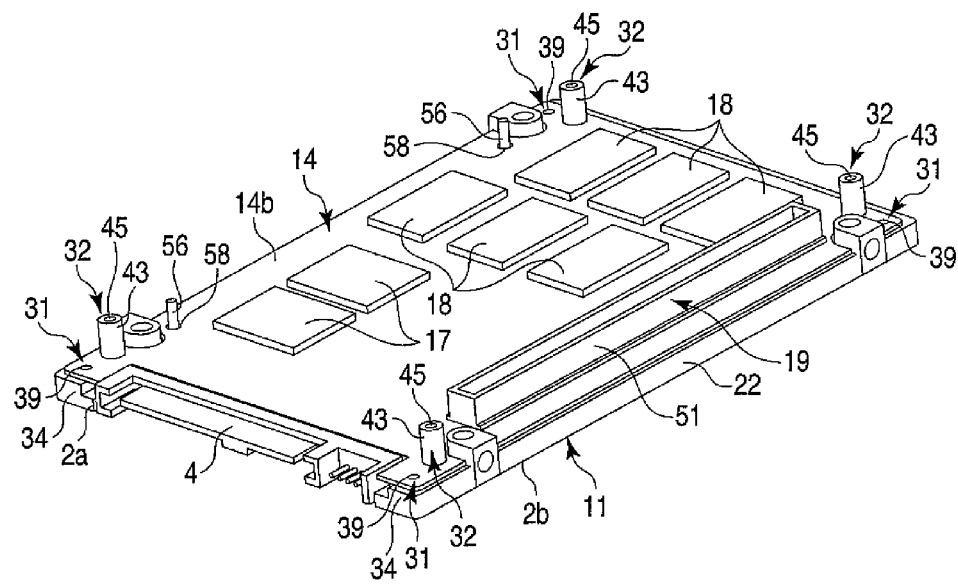
FIG. 9 is a perspective view illustrating a main board attached to the base, for example as shown in FIG. 2.

As shown in FIGS. 4 and 9, the first portion 51 of the connector 19 is on the second surface 14b of the main board 14. The connector 19 comprises, for example, plural connection pins and has a relatively large size. The connector 19 is along the edge of the main board 14 and is disposed on the outermost end portion of the main board 14. That is, no component is mounted between the connector 19 and the edge of the main board 14. As shown in FIG. 4, the first portion 51 of the connector 19 is arranged along the longitudinal side of the main board 14 with a rectangular shape. The connector 19 is disposed between two second fixing portions 32 (insertion holes 46).

As shown in FIG. 3, no component is mounted in a region (see a one-dot chain line A1) of the rear surface of the main board 14 corresponding to the connector 19. No component is mounted in a region of the main board 14 corresponding to at least both end portions of the connector 19, preferably, a region corresponding to both end portions and the center portion of the connector 19. However, components not damaged by pressure may be mounted in the region.

As shown in FIG. 5, the second portion 52 of the connector 19 is mounted on the first surface 15a of the daughter board 15. The connector 19 is along the edge of the daughter board 15 and is disposed on the outermost end portion of the daughter board 15. That is, no component is mounted between the connector 19 and the edge of the daughter board 15. The second portion 52 of the connector 19 is arranged along the longitudinal side of the daughter board 15 with a rectangular shape. The connector 19 is disposed between two second fixing portions 32 (insertion holes 46).

As shown in FIG. 6, no component is mounted in a region (see a one-dot chain line A2) of the rear surface of the daughter board 15 corresponding to the connector 19. No component is mounted in a region of the daughter board 15 corresponding to at least both end portions of the connector 19, preferably, a region corresponding to both end portions and the center portion of the connector 19. However, components not damaged by pressure may be in the region.

Figure 10:
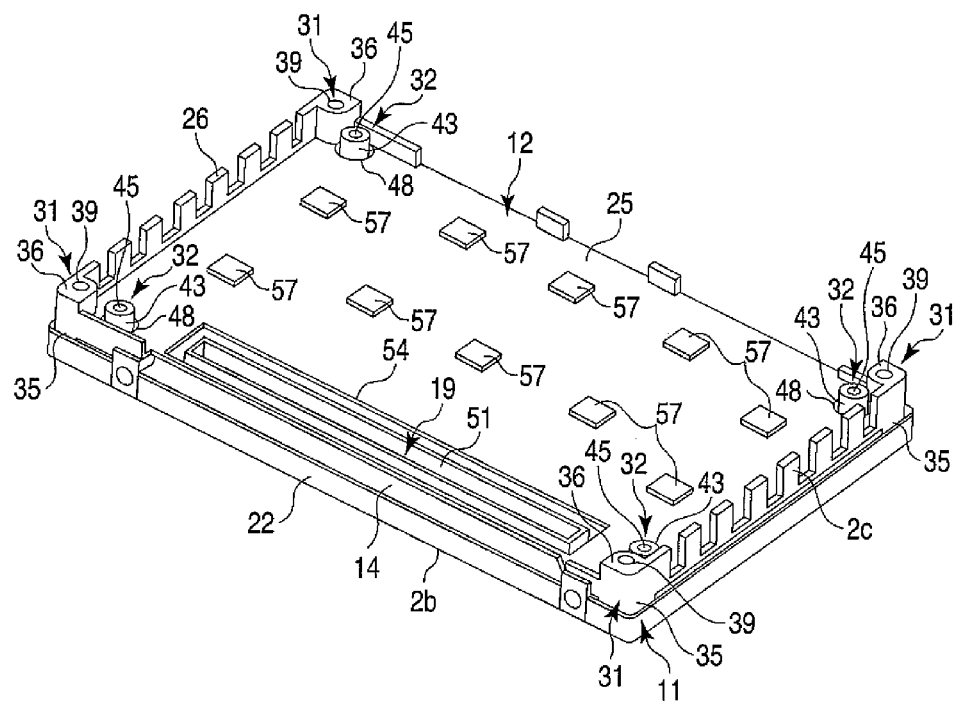
FIG. 10 is a perspective view illustrating a middle base as may be attached to the structure shown in FIG. 9.

As shown in FIG. 10, the middle base 12 comprises an opening portion 54 provided so as to avoid the connector 19. The connector 19 passes through the opening portion 54 of the middle base 12 and does not contact the middle base 12. The middle base 12 may comprise a cut-out portion provided so as to avoid the connector 19, instead of the opening portion 54.

As shown in FIG. 2, a heat radiating sheet 57 (thermally conductive sheet) is attached to the base 11. The heat radiating sheet 57 is interposed between the base 11, and the control IC 16, the DDR chip 17, and the NAND memory chip 18 of the main board 14 and thermally connects the components to the base 11.

In addition, the heat radiating sheets 57 are attached to both surfaces of the middle base 12. The heat radiating sheets 57 are interposed between the middle base 12, and the DDR chip 17 and the NAND memory chip 18 of the main board 14 and between the middle base 12 and the NAND memory chip 18 of the daughter board 15 and thermally connect the components to the middle base 12. Each of the DDR chip 17 and the NAND memory chip 18 is an example of a "heating component". The heat radiating sheet 57 is an example of a "thermally conductive member".

The middle base 12 is thermally connected to the components and functions as a heat radiating member. Since the middle base 12 has, for example, a relatively large thickness, it has high thermal conductivity. A portion (for example, the rising portion 26) of the middle base 12 is exposed to the outside of the housing 2 as a portion of the circumferential wall 2c of the housing 2. Therefore, it is possible to radiate most of the heat transmitted to the middle base 12 to the outside of the housing 2.

Next, the assembly of the SSD 1 will be described.

As shown in FIG. 7, the supporting portions 43 (studs) are attached to the main board 14. Specifically, the supporting portions 43 are fixed to the main board 14 by the screws 44. In addition, the supporting portions 43 are adhered to the main board 14 in order to prevent the rotation of the supporting portions 43.

As shown in FIG. 8, two positioning pins 56 are attached to the base 11. Specifically, the positioning pins 56 are pressed and inserted into the base 11. In addition, the heat radiating sheet 57 is attached to the base 11.

After the main board 14 and the base 11 are prepared in this way, as shown in FIG. 9, the main board 14 is attached to the base 11. In this case, the positioning pins 56 of the base 11 pass through positioning holes 58 of the main board 14 to position the main board 14 with respect to the base 11. Then, as shown in FIG. 10, the middle base 12 is attached onto the main board 14. In addition, the heat radiating sheet 57 is adhered to the middle base 12.

After the middle base 12 is attached, as shown in FIG. 11, the daughter board 15 is mounted on the middle base 12. The first portion 51 and the second portion 52 of the connector 19 are connected to each other to electrically connect the daughter board 15 and the main board 14. The screws 44 are inserted into the supporting portions 43 to fix the daughter board 15 to the main board 14.

Figure 12:
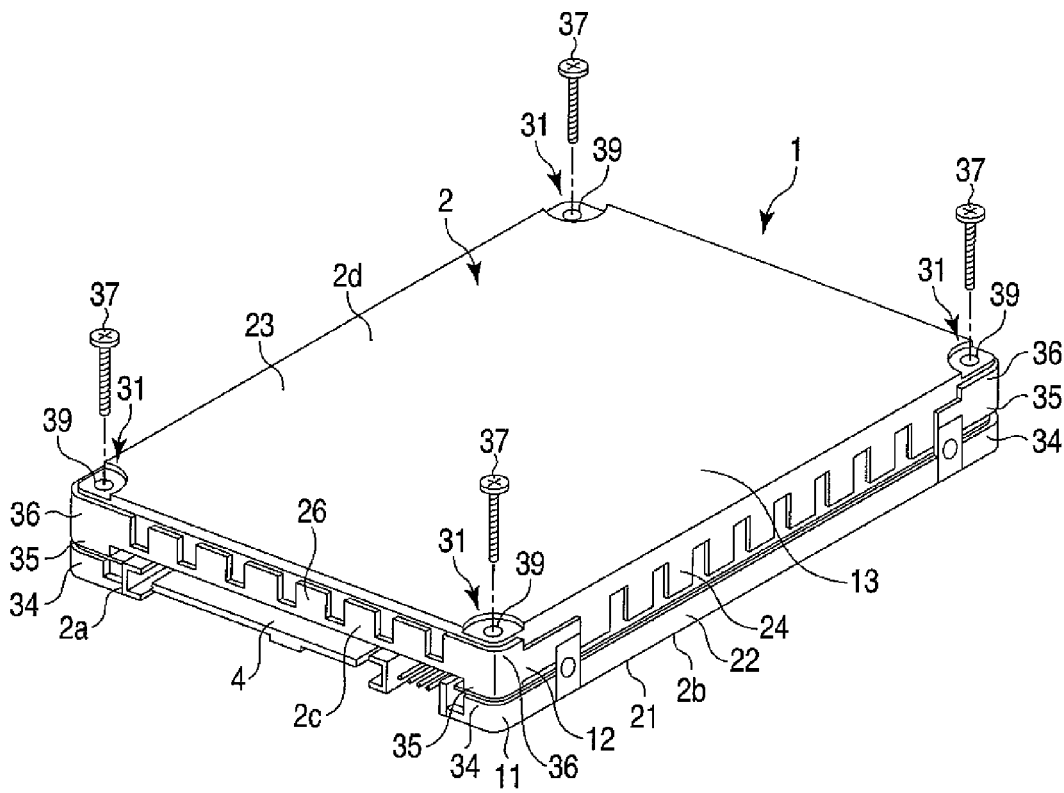
FIG. 12 is a perspective view illustrating a cover attached to a structure such as that shown in FIG. 11.

After the daughter board 15 is mounted, as shown in FIG. 12, the cover 13 is attached. Specifically, the cover 13 is arranged on the daughter board 15 and the cover 13, the middle base 12, the main board 14, and the base 11 are collectively fixed by the screws 37. A buffer sponge 59 (see FIG. 2) is adhered to the rear surface of the cover 13.

According to this structure, it is possible to improve the reliability of the SSD 1. Detailed operation and effects will be described in the following second embodiment.

Second Embodiment

Figure 13:
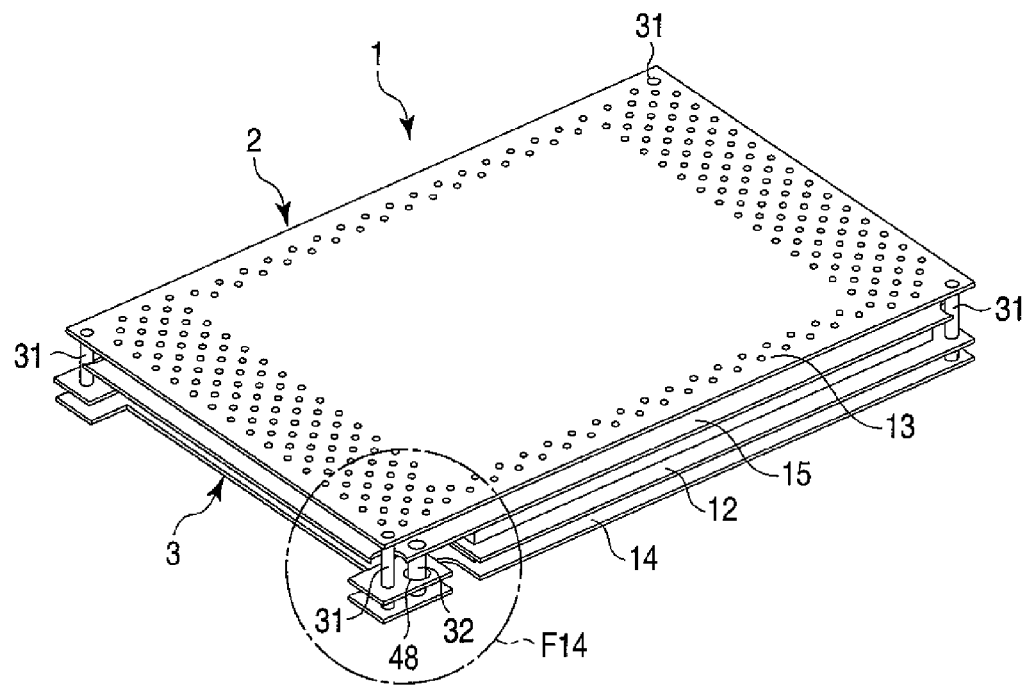
FIG. 13 is a perspective view illustrating an SSD according to a second embodiment.

Next, an SSD 1 according to a second embodiment will be described with reference to FIGS. 13 and 14. In the second embodiment, components having the same or similar functions as those in the first embodiment are denoted by the same reference numerals and a description thereof will be omitted. In addition, structures other than the following structures are the same as those in the first embodiment.

The SSD 1 according to this embodiment comprises a main board 14, a middle base 12, a daughter board 15, and a cover 13, similarly to the first embodiment. The first fixing portions 31 are provided so as to avoid the daughter board 15 and fix the main board 14, the middle base 12, and the cover 13. The second fixing portions 32 are provided so as to avoid the middle base 12 and fix the main board 14 and the daughter board 15.

A relatively small bottom cover (not shown) is attached to the lower surface of the main board 14. The bottom cover is small and the influence is limited. Therefore, a description thereof will be omitted in the analysis result shown in FIG. 15.

Figure 15:
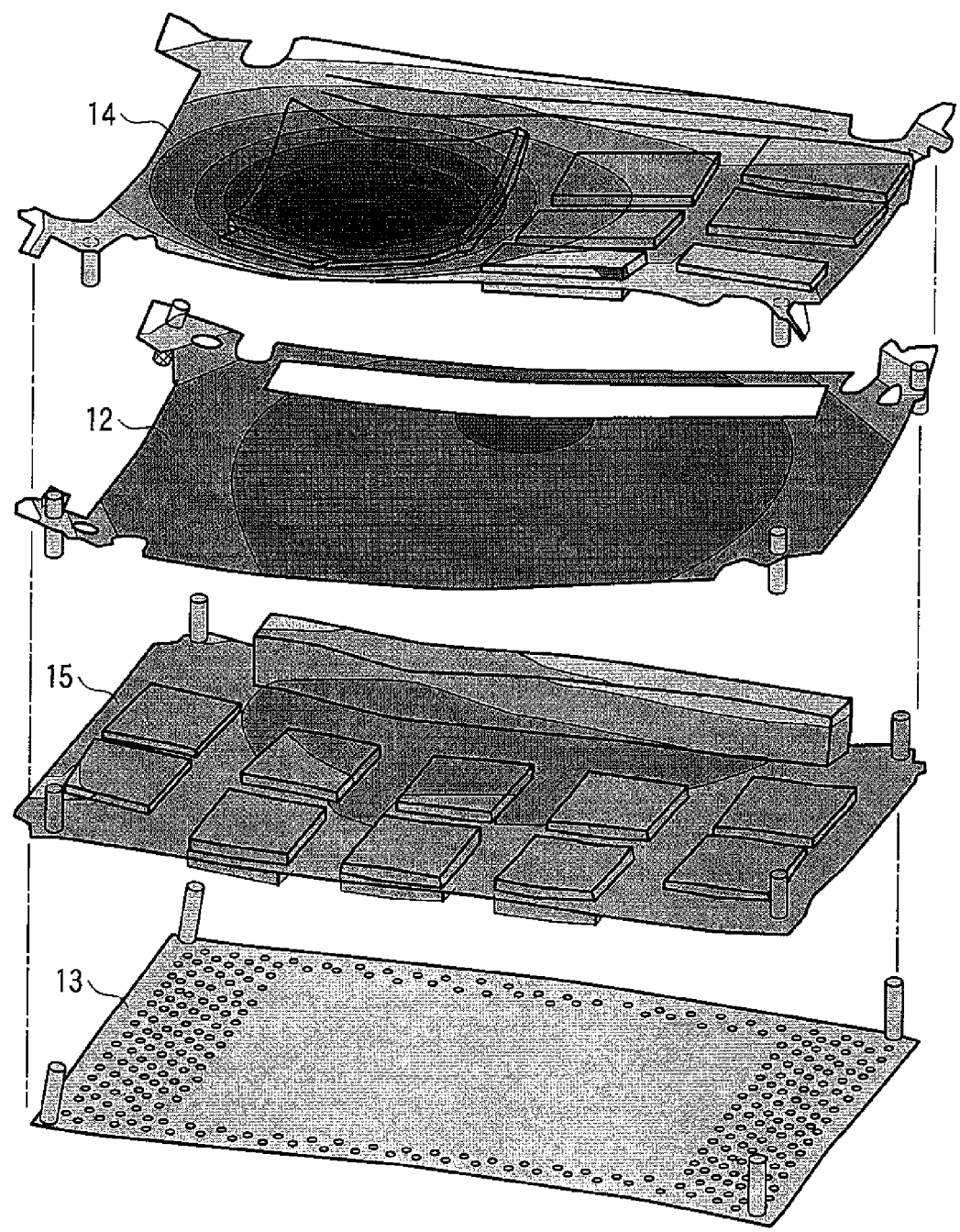
FIG. 15 is a diagram illustrating a displacement of an SSD such as that shown in FIG. 14 in the vertical direction.
Figure 17:
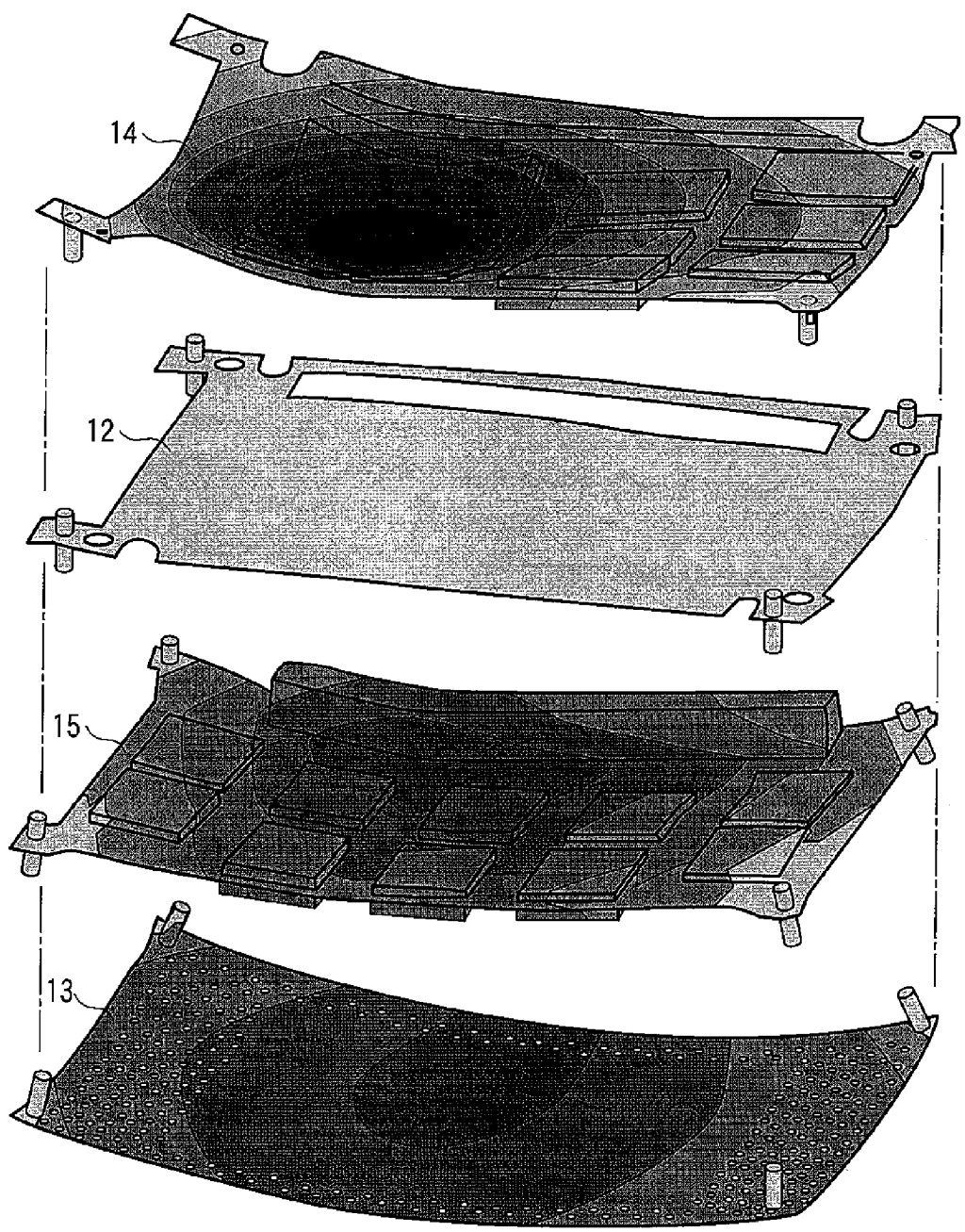
FIG. 17 is a diagram illustrating a displacement of a SSD such as that shown in FIG. 15 in the vertical direction.

Next, the operation of the SSD 1 according to this embodiment will be described with reference to FIGS. 15 to 17. In FIGS. 15 and 17, the shading of a color indicates the amount of displacement in the vertical direction. In FIGS. 15 and 17, the deeper the color is, the larger the amount of displacement is.

Figure 14:
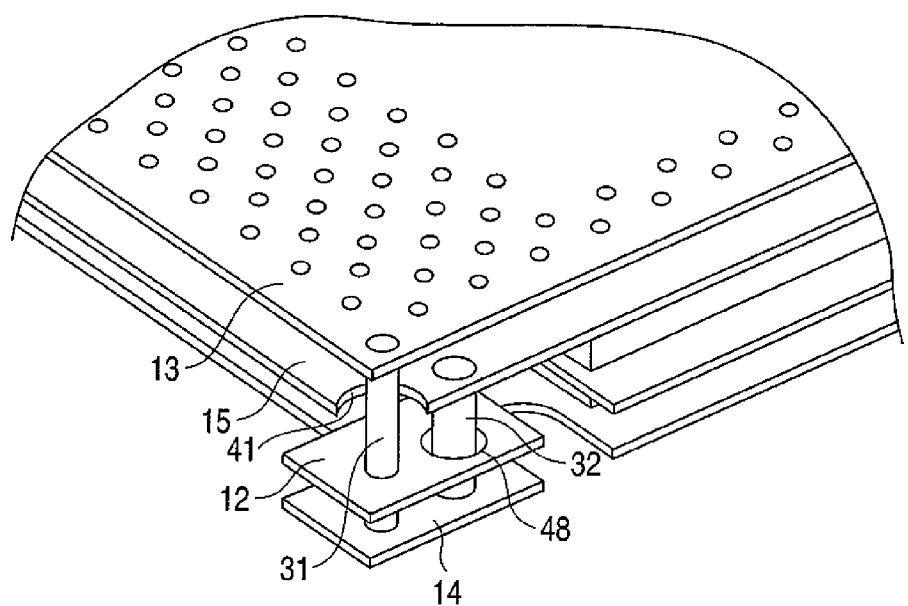
FIG. 14 is an enlarged perspective view illustrating a region surrounded by the line F14 in the SSD shown in FIG. 13.

An SSD 61 shown in FIG. 16 is for comparison with the structure shown in FIG. 14. In the SSD 61 shown in FIG. 16, the main board 14, the middle base 12, the daughter board 15, and the cover 13 are collectively fixed.

FIG. 17 shows the deformation of the SSD 61 shown in FIG. 16 during thermal expansion. As described above, during thermal expansion, the middle base 12 and the cover 13 which are made of a metal material are more likely to be expanded than the main board 14 and the daughter board 15. In addition, the expansion of the middle base 12 with a relatively large thickness and high rigidity is dominant. In the description with reference to FIGS. 17 and 15, an "upper side" and a "lower side" indicate the upper and lower sides of FIGS. 17 and 15.

As shown in FIG. 17, when the SSD 61 is thermally expanded, the middle base 12 is hardly warped. This is because the main board 14 and the daughter board 15 which are not to be expanded are connected to the upper side and the lower side of the middle base 12 which is to be expanded and the middle base 12 is drawn to the upper side and the lower side. As a result, the middle base 12 is hardly warped.

Therefore, in order to deform the main board 14 and the daughter board 15 so as to follow the middle base 12 that is hardly warped, the amount of deformation of the main board 14 and the daughter board 15 increases and a load acting on the main board 14 and the daughter board 15 also increases. In particular, a large load is applied to the main board 14 that is largely warped, which may have an adverse effect on the reliability of the SSD 61.

As shown in FIG. 17, the cover 13 is drawn to the daughter board 15 which is not to be expanded to the upper side. Therefore, the cover 13 is not sufficiently expanded, but is largely warped.

On the other hand, FIG. 15 shows the deformation of the SSD 1 shown in FIG. 14 during thermal expansion.

Since the daughter board 15 is not connected to the base 11, the middle base 12, and the cover 13, the daughter board 15 is not directly drawn to them. The daughter board 15 is deformed so as to follow the main board 14. Therefore, the amount of deformation of the daughter board 15 is small and a load applied to the daughter board 15 is also small.

As shown in FIG. 15, the amount of deformation of the main board 14 is also reduced. This is because the middle base 12 is warped when the SSD 1 is thermally expanded. That is, the middle base 12 to be expanded is drawn upward to the main board 14, but is not drawn downward to the daughter board 15. Therefore, the middle base 12 is appropriately warped.

Since the middle base 12 is warped, the amount of deformation of the main board 14 may be small and the load applied to the main board 14 is also reduced. When the amount of deformation of the main board 14 is reduced, the amount of deformation of the daughter board 15 following the main board 14 is also reduced. In this way, the load of the daughter board 15 is further reduced.

As shown in FIG. 15, since the cover 13 follows the middle base 12 which is to be expanded, the cover 13 can be expanded greatly. Therefore, for example, the warping of the cover 13 is also diminished.

Table 1 shows an example of the detailed analysis result. As can be seen from Table 1, for the equivalent stress of the lead portion of the connector 19, the equivalent stress of the daughter board 15 in the structure shown in FIG. 14 is about 15% less than that in the structure shown in FIG. 16. In addition, for the amount of displacement of the board in the vertical direction, the amount of displacement of each of the daughter board 15 and the main board 14 in the structure shown in FIG. 14 is less than that in the structure shown in FIG. 16. In particular, the amount of displacement of the daughter board 15 in the structure shown in FIG. 14 is about 45% less than that in the structure shown in FIG. 16.

TABLE 1

| | Daughter board | | Main board | |
| --- | --- | --- | --- | --- |
| | Structure shown in FIG. 14 | Structure shown in FIG. 16 | Structure shown in FIG. 14 | Structure shown in FIG. 16 |
| Equivalent stress of connector lead portion | 10.38 MPa | 12.12 MPa | 7.06 MPa | 7.03 MPa |
| Amount of displacement in vertical direction | 29.9 μm | 53.2 μm | 77.0 μm | 95.0 μm |

Table 2 shows the amount of displacement (maximum displacement) of each of the main board 14, the middle base 12, the daughter board 15, and the cover 13 in the vertical direction. As can be seen from Table 2, in the structure shown in FIG. 14, the warping of the middle base 12 is large. That is, since the middle base 12 is appropriately warped, the load applied to the main board 14 and the daughter board 15 is reduced.

TABLE 2

|  | Structure shown in FIG. 14 | Structure shown in FIG. 16 |
|---|---|---|
| Main board | 77.0 μm | 95.0 μm |
| Middle base | 41.1 μm | 8.5 μm |
| Daughter board | 29.9 μm | 53.2 μm |
| Cover | 12.9 μm | 51.8 μm |

According to this structure, it is possible to improve the reliability of the SSD 1. That is, it is possible to reduce the influence of the housing 2 on the daughter board 15 by separating the fixation structure of the daughter board 15 from the middle base 12 or the cover 13. In this way, the amount of deformation of the daughter board 15 is reduced and the equivalent stress of the daughter board 15 is reduced. Therefore, the reliability of the mounted components or the connector 19 is improved.

As described above, it is possible to reduce the load of the main board 14 by warping the middle base 12. In this way, it is possible to reduce the amount of deformation of the main board 14 and diminish the applied equivalent stress. Therefore, the reliability of the mounted components or the connector 19 is improved.

When the middle base 12 comprises the through holes 48 and the second fixing portions 32 pass through the through holes 48, it is possible to relatively simply achieve a structure in which the second fixing portions 32 are not fixed to the middle base 12. When the daughter board 15 comprises the cut-out portions 41 and the first fixing portions 31 pass through the cut-out portions 41, it is possible to relatively simply achieve a structure in which the first fixing portions 31 are not fixed to the daughter board 15.

When the connector 19 is mounted at the end portion of the main board 14, it is possible to minimize the influence of the board on the connector 19 due to thermal expansion. Since the connector 19 is mounted at the end portion of the main board 14, it is possible to effectively use the center of the board and perform high-density mounting.

When no component is in a region of the rear surface of the main board 14 corresponding to the connector 19, the connector can be fitted by strong pressing force in the vertical direction even though the connector has a relatively large size and requires strong fitting force.

Third Embodiment

Next, an electronic apparatus 71 according to a third embodiment will be described with reference to FIGS. 18 and 19. In the third embodiment, components having the same or similar functions as those in the first embodiment are denoted by the same reference numerals and a description thereof will be omitted. In addition, structures other than the following structures are the same as those in the first embodiment. The electronic apparatus 71 is, for example, a notebook PC.

Figure 18:
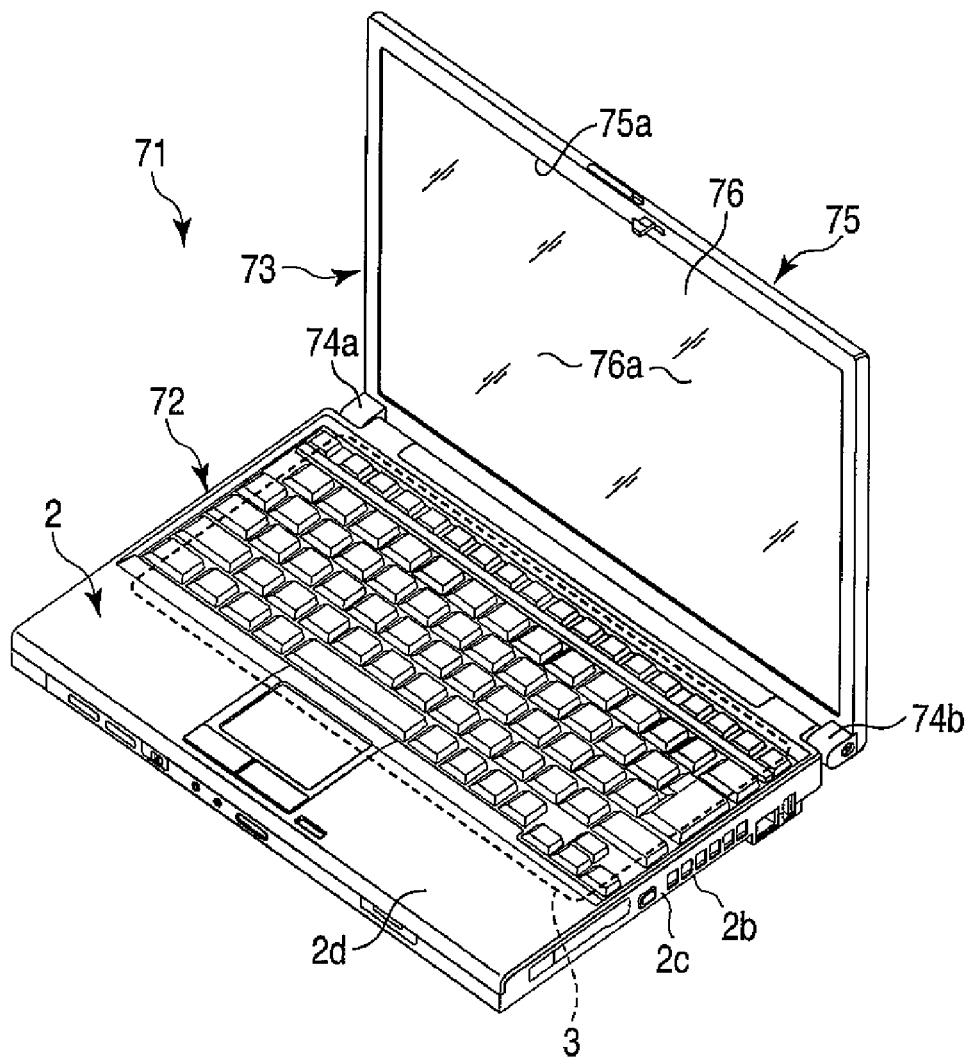
FIG. 18 is a perspective view illustrating an electronic apparatus according to a third embodiment.

As shown in FIG. 18, the electronic apparatus 71 comprises a main unit 72, a display unit 73, and hinges 74a and 74b. The main unit 72 is an electronic apparatus main body. The main unit 72 comprises a box-shaped housing 2 and a board unit 3 in the housing 2.

The display unit 73 comprises a display housing 75 and a display device 76 in the display housing 75. The display housing 75 comprises a relatively large opening portion 75a through which a display screen 76a of the display device 76 is exposed to the outside. The display unit 73 is rotatably connected to the main unit 72 by the hinges 74a and 74b.

Figure 19:
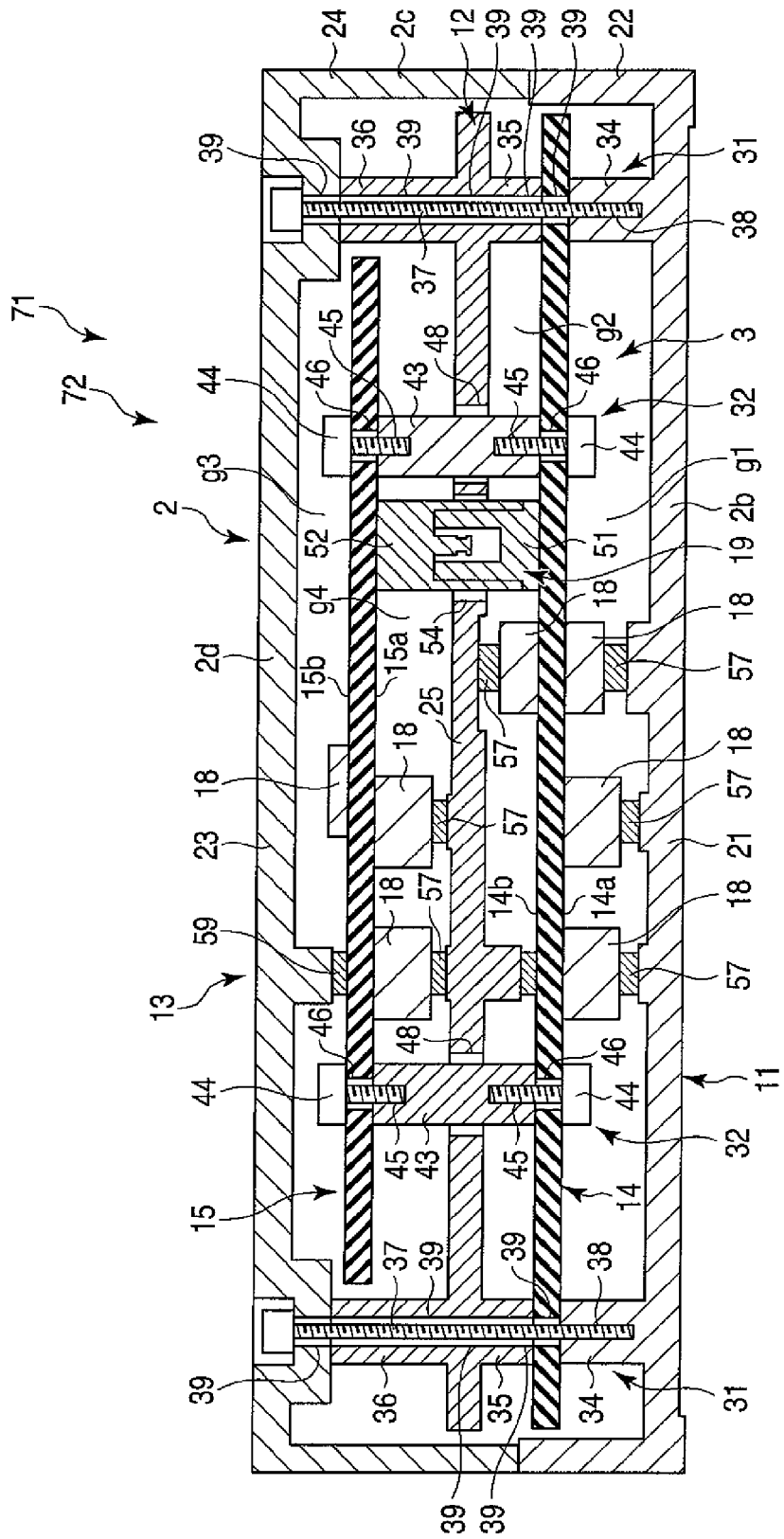
FIG. 19 is a cross-sectional view schematically illustrating the inside of an electronic apparatus such as that shown in FIG. 18.

As shown in FIG. 19, the electronic apparatus 71 according to this embodiment comprises a base 11, a main board 14, a middle base 12, a daughter board 15, and a cover 13, similar to the first embodiment. The first fixing portions 31 are provided so as to avoid the daughter board 15 and collectively fix the base 11, the main board 14, the middle base 12, and the cover 13. The second fixing portions 32 are provided so as to avoid the middle base 12 and fix the main board 14 and the daughter board 15.

As shown in FIG. 19, for example, the daughter board 15 is smaller than the main board 14 or the middle base 12. The daughter board 15 according to this embodiment may have the same size as, for example, the main board 14 or the middle base 12, similarly to the first embodiment. As shown in FIG. 19, the daughter board 15 according to the first embodiment may be smaller than the main board 14 or the middle base 12.

According to this structure, similar to the first and second embodiments, it is possible to improve the reliability of the SSD 1.

The SSDs 1 and the electronic apparatus 71 according to the first to third embodiments have been described above, but the invention is not limited thereto. The components according to the first to third embodiments may be appropriately combined with each other. The invention is not limited to the above-described embodiments, but various modifications and changes can be made without departing from the scope and spirit of the invention.

For example, the "fixing member" attached to the first fixing portion and the second fixing portion is not limited to the screw. For example, the fixing member may be a pin.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a first board comprising a first side;
a second board comprising a first side, wherein the first side of the second board faces the first side of the first board;
a middle base comprising a first side, wherein the middle base is between the first board and the second board and the first side of the middle base faces the first side of the first board and a side of the middle base opposite the first side of the middle base faces the first side of the second board;
a cover facing the second board from a side opposite to the middle base such that the middle base is not between the cover and the second board;
a first fixing portion attached to the first board, the middle base, and the cover; and
a second fixing portion attached to the first board and the second board,
wherein the second fixing portion is not attached to the middle base and the cover.

2. The storage device of claim 1, wherein the first fixing portion is not attached to the second board.

3. The storage device of claim 1, further comprising:
a base facing the first board from a side opposite to the middle base and attached to the first fixing portion, such that the base faces a side of the first board opposite the first side of the first board and that the middle base is not between the base and the first board.

4. The storage device of claim 1, further comprising:
a connector comprising a first portion on the first board abutting at least a region of a front suface of the first board, comprising a second portion on the second board, and configured to connect the first board to the second board.

5. The storage device of claim 4, wherein the connector is along an edge of the first board.

6. The storage device of claim 4, wherein no pressure-damageable component is mounted in a region of a rear surface opposite the front surface of the first board, the region of the rear surface corresponding to the region of the front surface abutting the connector.

7. A storage device comprising:
a first board comprising a first side;
a second board comprising a first side, wherein the first side of the second board faces the first side of the first board;
a middle base comprising a first side, wherein the middle base is between the first board and the second board and the first side of the middle base faces the first side of the first board and a side of the middle base opposite the first side of the middle base faces the first side of the second board;
a cover facing the second board from a side opposite to the middle base such that the middle base is not between the cover and the second board;
a first fixing portion attached to the first board, the middle base, and the cover; and
a second fixing portion attached to the first board and the second board, wherein the middle base comprises a hole, and
the second fixing portion passes through the hole of the middle base.

8. A storage device comprising:
a first board comprising a first side;
a second board comprising a first side, wherein the first side of the second board faces the first side of the first board;
a middle base comprising a first side, wherein the middle base is between the first board and the second board and the first side of the middle base faces the first side of the first board and a side of the middle base opposite the first side of the middle base faces the first side of the second board;
a cover facing the second board from a side opposite to the middle base such that the middle base is not between the cover and the second board;
a first fixing portion attached to the first board, the middle base, and the cover; and
a second fixing portion attached to the first board and the second board, wherein the second board comprises a cut-out portion, and the first fixing portion passes through the cut out portion of the second board.

* * * * *